(12) United States Patent
Tilley et al.

(10) Patent No.: US 6,356,217 B1
(45) Date of Patent: Mar. 12, 2002

(54) ENHANCED DC OFFSET CORRECTION THROUGH BANDWIDTH AND CLOCK SPEED SELECTION

(75) Inventors: Keith A. Tilley, Round Rock, TX (US); Raul Salvi; Enrique Ferrer, both of Miami, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,843

(22) Filed: Feb. 29, 2000

(51) Int. Cl.⁷ .................................................. H03M 1/10
(52) U.S. Cl. ........................................ 341/118; 455/138
(58) Field of Search ................................. 341/118, 120; 455/138

(56) References Cited

U.S. PATENT DOCUMENTS

| | | | |
|---|---|---|---|
| 4,653,117 A | 3/1987 | Heck | 455/209 |
| 5,079,526 A | 1/1992 | Heck | 332/127 |
| 5,087,914 A | 2/1992 | Sooch et al. | |
| 5,212,826 A * | 5/1993 | Rabe et al. | 455/214 |
| 5,483,691 A | 1/1996 | Heck et al. | 455/234.2 |
| 5,584,059 A | 12/1996 | Turney et al. | 455/126 |
| 5,617,473 A | 4/1997 | Wietecha et al. | 379/399 |
| 5,724,653 A * | 3/1998 | Baker et al. | 455/296 |
| 5,748,681 A * | 5/1998 | Comino et al. | 375/319 |
| 5,789,974 A | 8/1998 | Ferguson, Jr. et al. | 330/2 |
| 5,877,645 A * | 3/1999 | Comino et al. | 327/350 |
| 5,893,029 A | 4/1999 | Bastani | 455/324 |
| 6,006,079 A | 12/1999 | Jaffee et al. | 455/310 |
| 6,114,980 A | 9/2000 | Tilley et al. | |
| 6,191,715 B1 * | 2/2001 | Fowers | 341/120 |
| 6,225,848 B1 | 5/2001 | Tilley et al. | |

\* cited by examiner

*Primary Examiner*—Howard L. Williams
(74) *Attorney, Agent, or Firm*—James M. Lamb; Frank A. Scutch; Randall S. Vaas

(57) ABSTRACT

A DC offset correction method and apparatus. In a DC offset correction loop (100), a DC offset is corrected using a binary search routine or any other digital or analog DC offset correction technique. In this binary search routine, the sign of the offset (138) is used to control a direction in which a digital to analog converter (DAC) (166) is stepped until the least significant bit of the DAC is set. The process is enhanced by opening up the bandwidth of the baseband filters (130) to permit the binary search to be clocked (180) at a higher clock rate. After the correction is established, the filters (130) are reset to normal operating conditions.

19 Claims, 3 Drawing Sheets

ENHANCED DC OFFSET CORRECTION THROUGH BANDWIDTH AND CLOCK SPEED SELECTION

CROSS REFERENCE TO RELATED DOCUMENTS

This application is related to patent application U.S. Pat. No. 6,225,848 by Tilley, et al., entitled "Method and Apparatus for Settling and Maintaining a DC Offset," which is a continuation-in-part of pending application Ser. No. 09/290,564 filed Apr. 13, 1999, Tilley, et al., entitled "Method and Apparatus for Settling a DC Offset," and also related to patent application Ser. No. 09/515,288 by Charles R. Ruelke, entitled "DC Offset Correction Loop for Radio Receiver," and Ser. No. 09/515,834 by Ferrer, et al., entitled "DC Offset Correction Adaptable to Multiple Requirements," filed concurrently herewith, assigned to Motorola, Inc., and incorporated herein by reference.

TECHNICAL FIELD

This invention relates to techniques and apparatus for rapidly correcting for DC offsets in electronic circuits.

BACKGROUND OF THE INVENTION

In certain applications for DC offset correction, there is a requirement that the speed of settling the offset correction loop be very fast. For example, in GSM radio receivers, the DC offset correction loop must be settled to within ±30 mV within 400 µS at the output of the baseband filter. This is a very stringent requirement to be met. Once the loop is settled, even small changes in DC offset can present problems such as saturation of the baseband signal path.

In the above cross-referenced patent application, a binary search method is used to correct DC offset in an electronic circuit. The technique described is particularly useful when applied to a Zero IF (ZIF) or a Direct Conversion Radio Receiver (DCR). The techniques can also be used in other applications including radio transmitters. In this binary search technique, the sign of the DC offset is used to determine whether a correction made via a digital to analog converter (DAC) is to be incremented or decremented in accordance with a binary search algorithm in order to correctly compensate for the DC offset. This process operates very quickly when compared with more conventional analog techniques. However, the bandwidth of the baseband filters in the signal path limits the speed with which the correction can be accomplished. Each time the DAC is incremented during the binary search process, it essentially applies a step voltage function to the input of the baseband signal path. This step function will produce a transient response from the baseband filters (and other circuitry) which has to settle before the next step in the correction process takes place. The settling of the filters in response to the DAC's step by step correction of the DC offset places a limitation on how fast the baseband DC offset can be corrected. Accordingly, there is a need for even faster techniques for settling out baseband DC offset, particularly in radio receivers.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
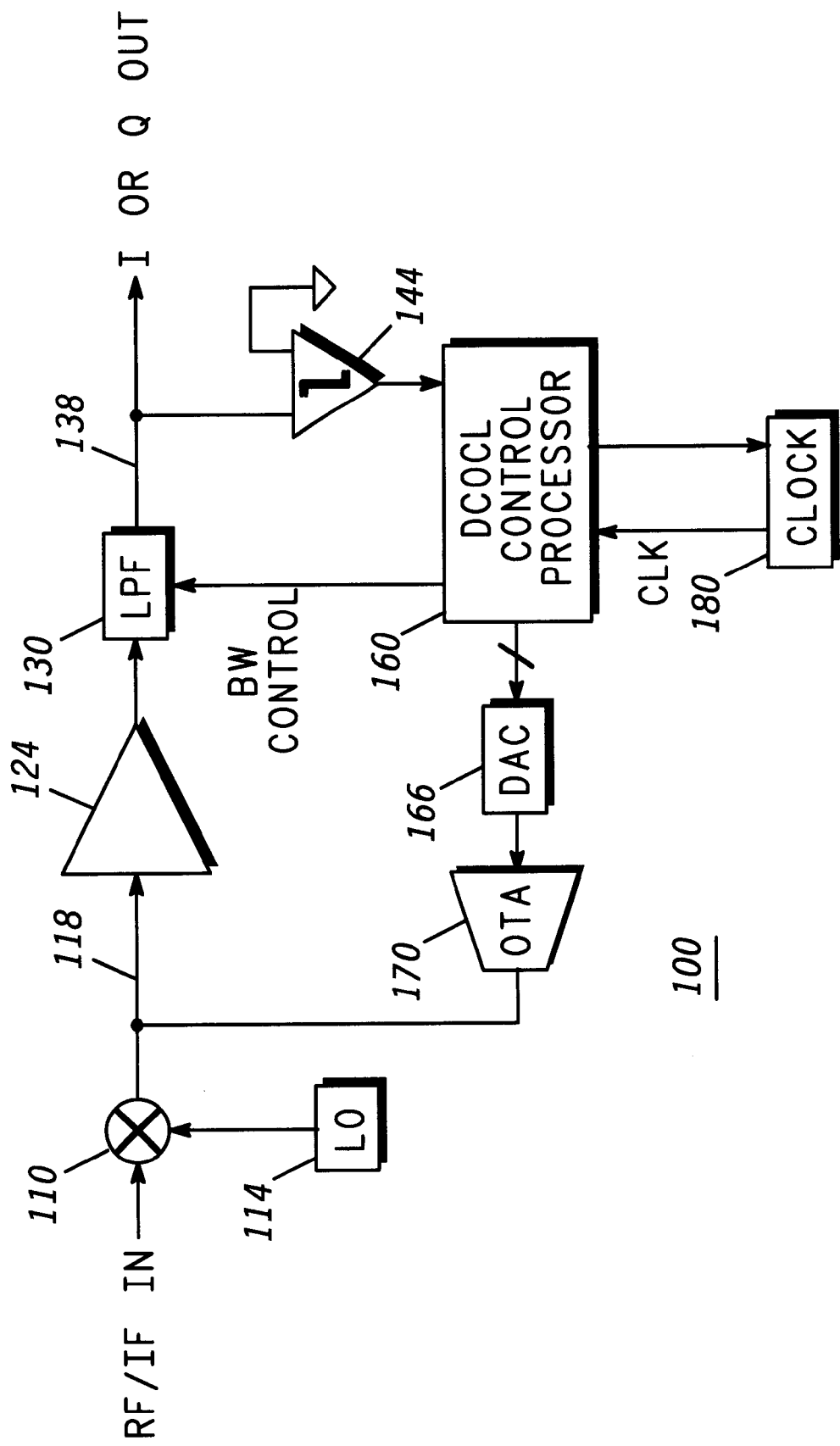
FIG. 1 is a block diagram of a DC offset correction loop embodied in a radio receiver.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawing.

Briefly, the preferred DC offset correction loop of the present invention incorporates a sign controlled binary search in combination with a digital-to-analog converter to correct for DC offsets in electronic circuits. This binary search process is enhanced by widening the bandwidth of the baseband filters and speeding up the clock on the process (or minimizing the wait time for settling of the transient response) as much as the filters will allow to, thus, speed up the binary search offset correction process. This bandwidth widening technique can also be applied to other digital and analog DC offset correction techniques.

Turning now to FIG. 1 a radio receiver 100 embodiment of the current DC offset correction loop method and apparatus is shown, but the invention is equally applicable to transmitters and other electronic devices. In this figure, RF or IF input signals are received at a mixer 110. For loops not embodied in a radio receiver, the loop might be preceded by other circuit components (e.g. an amplifier or filter). Mixer 110 mixes the RF or IF signal with a local injection oscillator signal from local oscillator 114 to produce a mixer output signal at 118. The mixer output signal at 118 includes a baseband signal that is processed by various amplifiers represented by low pass filter amplifier 124 and filters represented by 130 at baseband. In the present invention, the filters are preferably filters that have programmable bandwidth which can be controlled over a range of values. At the output 138 of filter 130, the baseband I (in phase) or Q (quadrature) value is presented for processing. Those of ordinary skill in the art will recognize that I and Q may be represented by a differential pair of complimentary signals. Moreover, those of ordinary skill in the art will understand that for a system that uses the quadrature I and Q signals, as in the example illustrated, a dual receiver path is normally present in the receiver. Only a single ended path for either the I or Q signal path of a radio receiver is shown for simplicity.

In order to carry out the enhanced binary searching DC offset loop correction of the present invention, only the sign of the DC offset of the signal 138 is examined. It is ultimately the DC offset at 138 which is to be corrected. The I or Q signal at 138 is applied to a comparator 144 which generates a signal representing the sign (+or −) of the signal at 138. The sign of the signal at 138 is applied to a DC Offset Correction Loop (DCOCL) control processor 160. Processor 160 may be realized as a separate hardware device such as a Digital Signal Processor or microcontroller or custom circuit, or may be embodied in a control microprocessor that exercises overall control over the radio receiver. The control processor 160 implements a binary search routine, as will be described shortly, and instructs Digital to Analog Converter (DAC) 166 to produce and hold a desired analog voltage output. This analog voltage output is applied as a step change in voltage to an Operational Transconductance Amplifier 170 which drives node 118 to a DC level which ultimately compensates for the error in DC offset in the system. The system operates in accordance with a clock signal from clock 180 with the clock rate being limited by the speed at which the transient response of the filters 130 settle in response to the step function being applied at 118.

In accordance with the current embodiment of the present invention, a binary search routine is executed by the DCOCL control processor 160 as follows. With no input signal present at mixer 110, a DC offset will be present at the output 118 of mixer 110 for which a correction is desired. The condition of no input signal at mixer 110 can be achieved by disabling the preceding amplifier circuits, for example. Equivalently, the local injection oscillator 114 can be disabled to produce no local oscillator injection signal to the mixer 110. Other techniques can also be used. In any case, no output other than the DC level is present at the output 118 of the mixer 110. The amplifier 124 amplifies this DC offset and produces an amplified DC offset at 138 (assuming minimal contribution to offset by filter 130).

The amplified DC offset at 138 is fed back to the comparator 144 which serves as a sign bit generator to generate a signal representative of whether the signal is greater than or less than an ideal reference value. In accordance with the exemplary present embodiment of the binary search, the sign bit is used as an input to the DCOCL control processor 160 to determine which direction to move the offset correction. The DCOCL control processor 160 receives the sign information and a clock input signal, and generates a bit string to step the DAC 166. Each time the DAC 166 is stepped, a new correction voltage is generated which is used to correct the DC offset present at the mixer output 118.

In accordance with the present embodiment of the binary search, the only information being fed back to the DCOCL control processor 160 is the direction in which to correct the offset. The DCOCL control processor uses the sign information to step the DAC 166 through a binary search of DAC settings, taking one step for each adjusted DC offset, until the DAC has been stepped to its least significant bit thereby providing a final correction voltage. Thus, the offset correction loop is able to determine an appropriate DAC setting in the minimum amount of time. Other digital and analog offset corrections can also be enhanced by use of the bandwidth change aspect of the present invention.

For a binary search algorithm, operation preferably begins at a predetermined DAC setting of $2^N/2$, where N represents the number of bits. The direction of each DAC step is based on the sign information. The initial step of the DAC will be $2^N/2^2$. The steps will then become incrementally smaller each time according to the pattern $2^N/2^2$, $2^N/2^3$, $2^N/2^4$ ... $2^N/2^N$. When the DAC steps $2^N/2^N$, the least significant bit (LSB) will have been adjusted, and the search is complete. For some applications, other start points may be desired. The DCOCL control processor 160 steps the DAC 166 up or down using incrementally smaller steps until the LSB is achieved. For each transition coming through the DAC 166 the bit settings change and this change in bit settings changes the output of the DAC 166. The changes in the output of the DAC 166 (through OTA 170) are summed with the output of mixer 110 to achieve the offset correction. Each change in the output of DAC 166 in effect applies a step change in DC voltage to 118. After the transient response (step response) of the amplifiers 124 and filters 130 decays adequately (to an insignificant contribution) the sign information is determined from comparator 144. The DC offset is adjusted through each step, which in turn potentially modifies the sign information as the process proceeds. Once the final step has been reached, the DAC 166 setting is held constant until another correction sequence is initiated.

For this offset correction process, the final correction is achieved in N-1 clock cycles. This is a fixed amount of time which will be used regardless of whether the initial offset is large or small. Since the number of clock cycles of clock 180 is fixed, the process could be speeded up if the clock operated at a faster clock speed. Unfortunately, the time that the loop requires to settle is dependent upon the bandwidth of the filters. Thus, the ability to speed up the clock is not an independently controllable variable. However, one of the advantages of a Zero IF or Direct Conversion Receiver is that the baseband filtering can be integrated to effect small size in the baseband filters 130. Accordingly, by properly designing the baseband filters 130 to be selectively programmable, both the clock speed and the bandwidth of the baseband filters 130 can be adjusted to effect a faster settling time and enhance the speed of the DC offset correction. If the baseband filters 130 remain at their normal bandwidth for operation of the receiver, the speed with which the DC offset correction can be carried out is limited.

In the present binary search embodiment, the DC offset correction process utilizes bandwidth control from the DCOCL control processor 160 to open up the bandwidth of filter 130. With the filter bandwidth increased, preferably to its maximum bandwidth, the binary search process is executed at a higher clock speed from clock 180 than that which would be possible without modification of the filter bandwidth. The clock is programmed to operate at a faster rate by DCOCL control processor 160. The higher speed can be achieved because a wider bandwidth filter responds more quickly to the step functions applied at 118 than a narrower bandwidth filter. Once the N-1 steps of DAC 166 are completed, the clock speed of clock 180 can be returned to a slower rate if necessary. For purposes of this invention, the faster rate of the clock is merely indicative that the rate is faster than would be permitted by narrower bandwidth filters.

The clock 180 is generally based on a high frequency oscillator which is divided down to appropriate speeds to operate various functions throughout the radio. The binary search algorithm is timed by the clock, but those having ordinary skill in the art will recognize that the algorithm operates by applying a step change in the DC voltage at 118. Whether the clock actually runs at a faster speed or not is not as important as the fact that the binary search process operates faster. That is, once the DC output of DAC 166 changes and the step change in DC voltage is applied to node 118, a time delay is invoked in the process to await the settling out of the transient response of the filter 130 and amplifier 124 in response to the step function. Once this transient response has decayed to an acceptable level, the next change in DC voltage at the output of DAC 166 can be imposed, the change being based upon the sign of the output of comparator 144. Thus, the invention can be implemented by actually setting the clock speed under which the binary search operates, or by adjusting a delay so that the delay is minimized between voltage steps at the output of the DAC 166 during the binary search. In either case, the process can be conceptually viewed as a change in clock speed permitted by the increase in bandwidth of the baseband filters 130.

For a binary search process taking N−1 steps to implement, N−1 delay times are encountered to await the settling of the transient response. In this case a conventional binary search process would take the following amount of time to execute:

Total time=(N−1)·(delay)+K

Where K is the time required for other parts of the binary search process such as processing the sign information and changing the DAC output.

Assume the delay can be reduced by a factor of c. Thus, by modifying the wait periods in accordance with the improved speed of transient settling, the process can be speeded up to:

Total time=(N−1)·(delay/c)+K

Since K is a small part of the time required for the binary search process, a reduction in delay time of a factor of c nearly reduces the total time by a factor of c.

The following method can be used to describe the DC offset correction technique in accordance with the enhanced binary search of the present invention. The technique is initialized by setting bandwidth of the baseband signal filters 130 to their maximum bandwidth and setting the clock speed to the fastest speed which will permit settling of the offset at the widest filter bandwidth setting. The DAC 166 is then set to a predetermined setting. Next, the DC offset present at the output of mixer 118 is amplified to produce an amplified DC offset. Then, in accordance with the present embodiment of the invention, the steps of determining an offset sign based on the amplified DC offset, stepping the DAC 166 by a predetermined amount in a direction indicated by the offset sign, and generating an analog voltage in response to the stepped DAC 166, are executed. Next the DC offset at the output of the mixer 110 is adjusted in response to the analog voltage. The steps are repeated until the least significant bit (LSB) of the DAC 166 has been adjusted. At this point, the bandwidth of the filter 130 is adjusted back to its normal setting. If necessary, the clock speed is returned to a normal operating speed. The DC offset correction value applied to 118 is maintained by the DAC 166 setting until a new programming event occurs, and a new DC offset correction is initiated in response to the new programming event.

For this search technique, N−1 clock cycles are used, where N is the number of DAC 166 bits. However, since the clock cycles are faster than the normal clock cycle, the process is speeded up. Upon completion of the search, the DAC 166 setting is preferably held until the entire procedure is re-initiated by a programming event. The clock rate of clock 180 is selected such that the DC offset at 138 settles before another change in the DAC 166 is attempted.

Increased precision may be obtained through the use of additional DACs and OTAs to provide greater precision in the offset voltage correction. Alternatively, DACs with greater range of precision can be used to effect higher precision correction if desired. In one technique, as described in the related application Ser. No. 09/290,564, a coarse tuning DAC with 6 bits is used to provide a coarse level of offset while a fine tuning DAC provides 7 bits of fine offset correction. In this example, the total resolution achieved is 13 bits, however it should be noted that each of the DACs is stepped through the correction process independently. So, the offset correction is achieved in:

(6−1)+(7−1)=11 clock cycles.

If this circuit arrangement is used with the present invention, 11 clock cycles will still be required, however, they will be 11 faster clock cycles. Thus, the present scheme can be used with any binary search offset correction process to enhance the speed of correction. In fact, the process of adjusting the clock speed along with the filter bandwidth may be usable with other types of DC offset correction schemes without departing from the invention. The offset correction process depends upon the baseband filter having minimal change in offset characteristics at the output 138 between wide bandwidth settings and the operational setting for the particular system at hand.

Thus, in order to realize the benefits of the present invention, the baseband filters should be carefully designed to have similar offset between the widest setting and the operational setting of bandwidth. The system design can also affect the degree to which the present invention is useful. By placing the baseband filtering as far down the signal path as possible, their offset will not be amplified by subsequent amplifier stages to accentuate the effect of any DC offset presented by the filter. But, even this effect is minimal if the filter offset is consistent without regard for the bandwidth setting.

Figure 2:
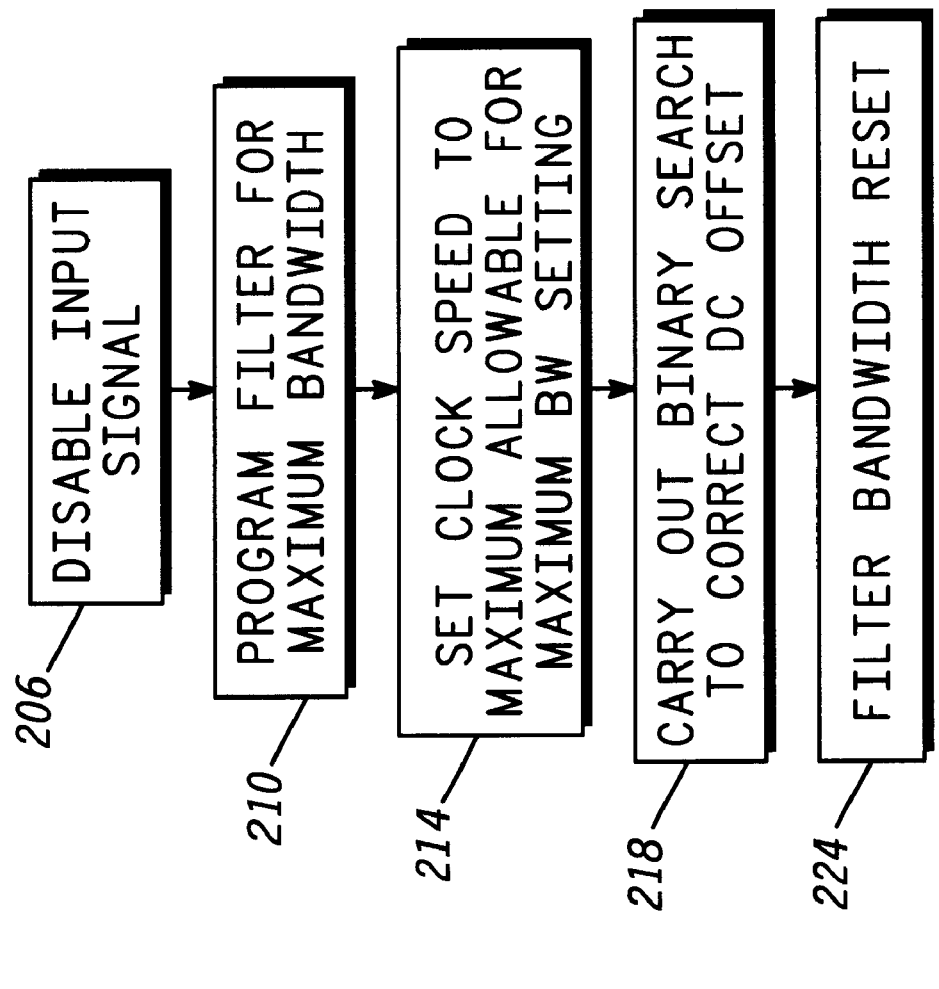
FIG. 2 is a flow chart of the operation of a first embodiment of the present invention.

Referring now to FIG. 2, the process 200 just described can be summarized, wherein at 206 the input signal to the mixer 110 is disabled (for the binary search embodiment). At 210, the baseband filters are set for a wide bandwidth—preferably a maximum bandwidth (within the constraints described above). At 214, the clock speed is set to a speed that is higher than the baseband filters would normally permit at the filter's normal operational bandwidth. The clock speed is preferably set as high as the wider filter bandwidth will permit while still allowing the DC offset at 138 to settle to an insignificant contribution to offset between changes in DAC setting. At 218, the binary search routine, or other suitable analog or digital DC offset correction process, is carried out with the higher clock rate until the DC is corrected. Finally, at 224, the filter bandwidth is reset for normal operation. The time required for the filter 130 to respond to the step in voltage so that the transient response is decayed to a negligible level compared with any remaining DC offset or compared to the minimum resolution of the DAC 166 is considered the step response decay time for purposes of this document. For example, this decay time can be considered to be approximately 5 time constants in some applications, but this is not to be limiting.

Those of ordinary skill in the art will understand that preferably the clock rate and bandwidth of the baseband filters can be changed dramatically to substantially effect improvements in offset correction times. However, various system constraints might impose limitations on the ability to do so. Accordingly, it should be understood that the present invention embraces those embodiments so long as the filter bandwidth is adjusted to permit faster execution of a DC offset correction process as taught herein. In an exemplary embodiment of the present invention using an integrated Zero IF radio receiver, the baseband filter bandwidth was programmable between 6 kHz and 48 kHz with the normal operational bandwidth being 18 kHZ. Under this constraint, it was found that the clock rate could be readily increased by a factor of 2.67 to achieve a speed increase in offset correction of 2.67 times that achieved without use of this invention. This higher clock rate would not have been usable without adjusting the filter bandwidth to its widest bandwidth since the transient response at 138 would not have settled before the next clock cycle. If the transient response at 138 is not settled before the next clock cycle, the sign value generated by comparator 144 will not reliably predict the direction which the DAC 166 should be incremented to effect the next level of correction in the binary search. Thus, it can be seen that the clock rate can be increased substantially beyond that rate at which the filters would normally permit by use of the present invention. If the clock can be increased by an amount which is greater than a clock rate which would permit the output of the filter 130 to settle when the filter is at its normal operational bandwidth, then a speed increase will be achieved.

Figure 3:
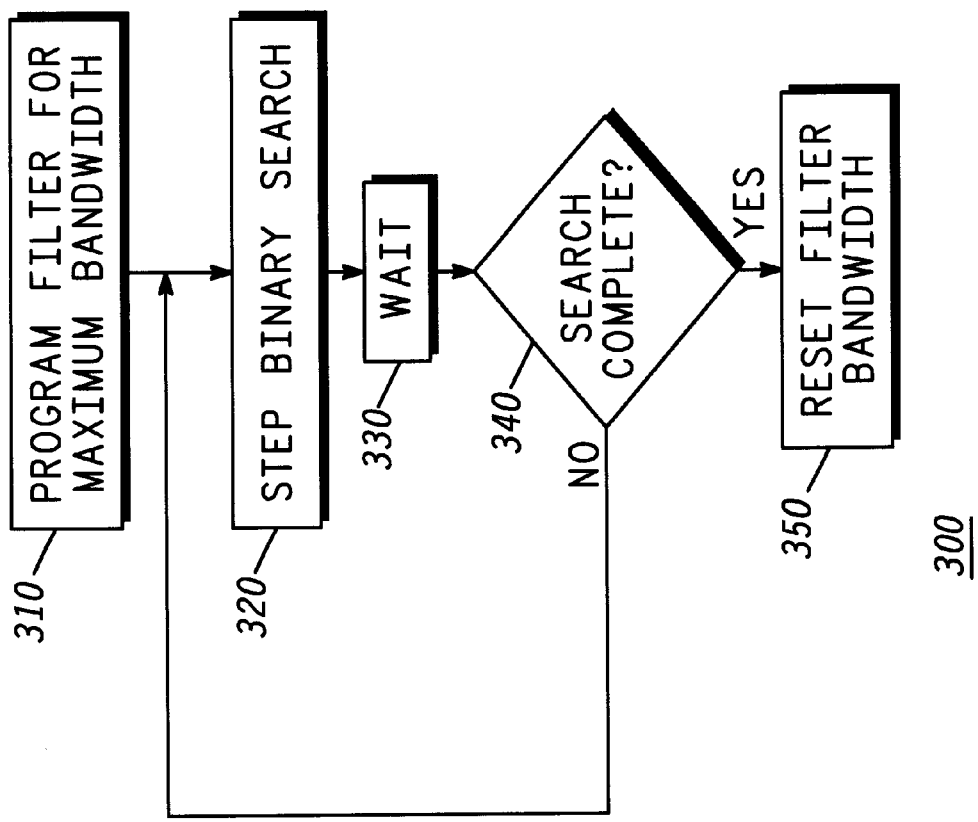
FIG. 3 is a flow chart of the operation of another embodiment of the present invention.

Referring now to FIG. 3, another embodiment of the process is shown as 300. In this embodiment, the clock rate is not as important as the delay time necessary for the settling of the transient response of the baseband filters 130 after application of a change in DC at 118. At 310, the baseband signal path filters' bandwidth is set to a wider than normal and preferably maximum bandwidth. At 320, the binary search process as described (or other suitable analog or digital DC offset correction technique) is initiated resulting in a DC offset voltage being applied at 118. At 330, the process invokes a wait period. The wait period is set according to the amount of time needed for the output at 138 to settle from the transient response created as a result of the DC offset voltage applied at 118. If the search is not complete at 340, the process returns to 320. Once all steps in the binary search have been completed, the filter bandwidth of filters 130 is reset to their normal operational bandwidth at 350. Since the wait time can be reduced compared with the wait time which would be required if the filters 130 were kept at their normal operational bandwidth, the process can be speeded up by an amount dependent primarily on the amount of bandwidth that the baseband signal path filtering can be increased.

Of course, in accordance with the processes described above, for an initial setting of the DC offset correction at powering on of a device, it is generally unnecessary to change either a clock rate or a bandwidth from those normally used under operational conditions. That is, the filter bandwidth and clock rate can be initialized at power-on to the wider bandwidth and faster clock rate in anticipation of the initial DC offset correction.

As illustrated in the above example, the process of correcting DC offset can be substantially enhanced by use of the technique of the present invention. In addition to enabling a device to be operational in a shorter period of time, the invention, in a radio transceiver environment, has additional benefits. In certain battery powered radio communications environments, the transceiver must be in a state of significant battery drain during the time of the DC offset correction. This shorter DC offset correction time can therefore result in longer battery life for the user. This is particularly true if the process must be frequently repeated due to changes in operating conditions.

While this invention has been described in terms of a radio receiver, those having ordinary skill in the art will understand that the invention can be broadly applied to any system having a need for DC offset correction. A notable example is that of radio transmitters. Moreover, although the present invention has been described in terms of use of a binary search DC offset correction technique, it is believed to be directly applicable to other digital DC offset correction techniques. Those having ordinary skill in the art will understand how to make similar and equivalent modifications to the specific exemplary technique disclosed.

Those of ordinary skill in the art will recognize that the present invention has been described in terms of exemplary embodiments based upon use of a programmed processor forming a part of the DC offset correction loop. However, the invention should not be so limited, since the present invention could be implemented using hardware component equivalents such as special purpose hardware and/or dedicated processors which are equivalents to the invention as described and claimed. Similarly, general purpose computers, microprocessor based computers, digital signal processors, micro-controllers, dedicated processors, ASICS and/or dedicated hard wired logic may be used to construct alternative equivalent embodiments of the present invention. In general, it is advisable that the processing resources available within the device having DC offset correction be used to the extent possible. For example, in the case of a radio receiver or transmitter, there is often a control process which carries out many of the functions of controlling the device. This control processor can be utilized to serve as the DC offset correction loop control processor.

Many variations will be evident to those of ordinary skill in the art. For example, the comparator 144 is used to determine the sign of the offset in the present invention, but other devices may equally well be used. Such devices include limiters, operational amplifier circuits and analog to digital converters, The embodiment disclosed is embodied in a radio receiver, however, the method and apparatus is equally applicable to other systems requiring DC offset correction including radio transmitters. Although the invention was disclosed in terms of an adjustable bandwidth integrated filter 130, any filter design in which the bandwidth can be adjusted with minimal change in the DC offset between bandwidth settings can be used to implement the invention. Thus, the invention is not limited to integrated filters as specifically discussed.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method of correcting a DC offset, comprising:
   providing a DC offset correction loop including a baseband filter having an output, wherein the baseband filter operates at an operational bandwidth and wherein the baseband filter has an adjustable bandwidth;
   adjusting the bandwidth of the baseband filter to a wider bandwidth than the operational bandwidth;
   carrying out a DC offset correction process which comprises successive application of a DC correction voltage to the loop at each of a plurality of clock cycles; and
   wherein the clock cycles are shorter in duration than a step response decay time for the baseband filter when the baseband filter is operating at the operational bandwidth, the wider bandwidth to permit the transient response to decay between successive applications of the DC correction voltage.

2. A method in accordance with claim 1, wherein the DC offset correction process comprises a binary search DC offset correction process.

3. A method in accordance with claim 2, wherein the DC correction voltage is set by a digital to analog converter.

4. A method in accordance with claim 1, wherein the DC offset correction process is carried out in a receive signal path in a radio receiver.

5. A method in accordance with claim 1, wherein the DC offset correction process is carried out in a transmit signal path in a radio transmitter.

6. A method in accordance with claim 1, wherein the DC offset correction is carried out for a receiver signal path of a radio receiver, and further comprising disabling the radio receiver to inhibit receipt of an input signal before carrying out the DC offset correction process.

7. A method for DC offset correction in the receive signal path in a radio receiver, comprising:
  setting a bandwidth of a signal path filter in the receive signal path to a value greater than an operational bandwidth;
  carrying out a DC offset correction process wherein a sequence of DC correction voltages are applied to a circuit node and wherein the signal path filter produces a transient response in response thereto;
  waiting for a period of time which is long enough for the transient response to decay between successive applications of the sequence of DC correction voltages; and
  setting the signal path filter to the operational bandwidth.

8. The method in accordance with claim 7, further comprising disabling the radio receiver to inhibit receipt of an input signal before carrying out the DC offset correction process.

9. A DC offset correction loop in the transmit signal path of a radio transmitter, comprising:
  a filter operating in the transmit signal path at an operational bandwidth, the filter's bandwidth being selectable between the operational bandwidth and a wider bandwidth that is wider than the operational bandwidth;
  a first circuit coupled to the transmit signal path, which applies selected DC offset correction voltages to the transmit signal path;
  a second circuit connected to the transmit signal path which measures a DC offset response of the signal path resulting from application of the voltages by the first circuit, and
  a controller receiving a measurement from the second circuit and controlling operation of the filter and the first circuit, wherein, the controller operates to:
    set the filter's bandwidth to the wider bandwidth;
    control the first circuit to apply a selected DC offset correction voltage;
    determine from the measurement by the second circuit of the DC offset response a revised DC offset voltage for application by the first circuit;
    repeat the controlling and determining until a final DC offset correction is selected; and
    change the filter's bandwidth to the operational bandwidth.

10. A radio DC offset correction system, comprising:
  a gain stage having a signal input, a bandwidth control input and an output, the gain stage including at least one amplifier for amplifying an input signal and an adjustable baseband filter for filtering the input signal, the baseband filter having an operation bandwidth and a wider bandwidth, the wider bandwidth being wider than the operation bandwidth, and the gain stage having a control input for receiving a bandwidth control signal responsive to which the baseband filter bandwidth is selected; and
  a controller coupled to the gain stage, the controller having a clock input, the controller generating the bandwidth control signal, and the controller generating DC offset correction signals responsive to the clock signal and the output of the gain stage, the controller controlling the baseband filter to have the wider bandwidth while the controller is selecting the DC offset, the wider bandwidth being selected to enable a higher clock rate for DC offset correction as the clock rate is limited by the speed at which the transient response of the baseband filter settles, and the controller controlling the baseband filter to have the operation bandwidth after DC offset selection.

11. The radio DC offset correction system according to claim 10, wherein the gain stage is in a radio receiver path of the radio.

12. The radio DC offset correction system according to claim 11, wherein the controller operates to disable the radio receiver to inhibit receipt of an input signal before carrying out the DC offset correction process.

13. The radio DC offset correction system according to claim 10, wherein the controller selects a DC offset voltage in a accordance with a binary search DC offset correction process.

14. The radio DC offset correction system according to claim 10, wherein the gain stage is in the transmit path in a radio transmitter.

15. A DC correction loop comprising:
  a gain stage in the communication path of a radio, the gain stage having an input with a DC offset, a bandwidth control input, and an output providing an amplified DC offset, the gain stage including an amplifier coupled to the signal input and a baseband filter having a controlled bandwidth responsive to the bandwidth control signal, the baseband filter coupled to the output and having an operational bandwidth and a wider bandwidth controlled responsive to the bandwidth control signal, the wider bandwidth being wider than the operational bandwidth;
  a sign generator coupled to the output of the gain stage and generating a sign bit in response to the amplified DC offset;
  a controller coupled to the sign generator and receiving a clock signal and the sign bit, the controller controlling the bandwidth of the baseband filter, the controller controlling the baseband filter to have the wider bandwidth while selecting a DC offset and the operational bandwidth after the DC offset is selected;
  a DAC coupled to the controller, the DAC being stepped in response to bits generated by the controller and converting the bits from the controller to an analog voltage; and
  the analog voltage being used to adjust the DC offset at the gain stage.

16. The DC correction loop according to claim 15, wherein the gain stage is in a radio receiver path of the radio.

17. The DC correction loop according to claim 16, wherein the controller operates to disable the radio receiver of the radio to inhibit receipt of an input signal before carrying out the DC offset correction process.

18. The DC correction loop according to claim 17, wherein the controller selects a DC offset voltage in accordance with a binary search DC offset correction process.

19. The DC correction loop according to claim 18, wherein the gain stage is in the transmit path in a radio transmitter.

* * * * *